(12) United States Patent (10) Patent No.: US 8,598,567 B2
Huang et al. (45) Date of Patent: Dec. 3, 2013

(54) COLOR-SELECTIVE QUANTUM DOT PHOTODETECTORS

(75) Inventors: Ludan Huang, Seattle, WA (US); Lih Y. Lin, Seattle, WA (US)

(73) Assignee: University of Washington through its Center for Commercialization, Seattle, WA (US)

( * ) Notice: Subject to any disclaimer, the term of this patent is extended or adjusted under 35 U.S.C. 154(b) by 204 days.

(21) Appl. No.: 13/109,816

(22) Filed: May 17, 2011

(65) Prior Publication Data

US 2011/0278541 A1    Nov. 17, 2011

Related U.S. Application Data

(60) Provisional application No. 61/345,478, filed on May 17, 2010, provisional application No. 61/438,502, filed on Feb. 1, 2011.

(51) Int. Cl.
*H01L 31/109* (2006.01)

(52) U.S. Cl.
USPC .............................................. 257/21; 257/257

(58) Field of Classification Search
USPC ..................................... 257/21, 257, E31.033
See application file for complete search history.

(56) References Cited

U.S. PATENT DOCUMENTS

2007/0289623 A1 * 12/2007 Atwater ........................ 136/252

OTHER PUBLICATIONS

De Vlaminck, I., et al., "Local Electrical Detection of Single Nanoparticle Plasmon Resonance," Nano Letters 7(3):703-706, Mar. 2007.
Ferry, V.E., et al., "Plasmonic Nanostructure Design for Efficient Light Coupling Into Solar Cells," Nano Letters 8(12):4391-4397, Dec. 2008.
Jin, R., et al., "Photoinduced Conversion of Silver Nanospheres to Nanoprisms," Science 294(5548):1901-1903, Nov. 2001.
Link, S., and El-Sayed, M.A., "Size and Temperature Dependence of the Plasmon Absorption of Colloidal Gold Nanoparticles," Journal of Physical Chemistry B 103(21):4212-4217, May 1999.
Mock, J.J., et al., "Shape Effects in Plasmon Resonance of Individual Colloidal Silver Nanoparticles," Journal of Chemical Physics 116(15):6755-6759, Apr. 2002.
Schaadt, D.M., et al., "Enhanced Semiconductor Optical Absorption Via Surface Plasmon Excitation in Metal Nanoparticles," Applied Physics Letters 86(6):063106-1-063106-3, Feb. 2005.
Tang, L., et al., "Nanometre-Scale Germanium Photodetector Enhanced by a Near-Infrared Dipole Antenna," Nature Photonics 2(4):226-229, Apr. 2008.

* cited by examiner

*Primary Examiner* — Tran Tran
(74) *Attorney, Agent, or Firm* — Christensen O'Connor Johnson Kindness PLLC

(57) ABSTRACT

Photoconductive optoelectronic devices, such as photodetectors and photovoltaics, are provided. The devices are sensitized to a particular wavelength (or range of wavelengths) of electromagnetic radiation such that the devices provide increased performance efficiency (e.g., external quantum efficiency) at the wavelength. The devices include a photoconductive semiconductor layer spanning an electrode gap between two electrodes to provide a photoconductive electrical conduit. Abutting the semiconductor layer is a plurality of plasmonic nanoparticles. The improved efficiency of the devices results from wavelength-dependent plasmonic enhancement of device photosensitivity by the plasmonic nanoparticles.

20 Claims, 9 Drawing Sheets

COLOR-SELECTIVE QUANTUM DOT PHOTODETECTORS

CROSS-REFERENCE TO RELATED APPLICATIONS

This application claims the benefit of U.S. Provisional Application Nos. 61/345,478, filed May 17, 2010, and 61/438,502, filed Feb. 1, 2011; the disclosure of each is incorporated herein by reference in its entirety.

STATEMENT OF GOVERNMENT LICENSE RIGHTS

This invention was made with Government support under grant number ECCS 0925378 awarded by the National Science Foundation (NSF). The Government has certain rights in the invention.

BACKGROUND

The pursuit of higher efficiency and lower cost is a constant theme in the field of light-absorbing optoelectronic devices such as photodetectors and photovoltaics. Among various approaches to enhance efficiency and reduce cost, plasmonic structures have generated interest.

A plasmon-optoelectronic system can be categorized by two main parts, a plasmonic component and an optoelectronic device component, and various combinations of the two have been studied. For the plasmonic component, structures previously explored include sputtered, evaporated, or annealed metal islands, and e-beam or focused ion-beam lithographically patterned nanoantennas. The control over the spectral position and line width of the plasmon resonance increases with each method, but the cost of e-beam or focused ion-beam lithography is significantly higher and not practical for large-scale production (optical lithography is also used for plasmonic components but the application is constrained to infrared wavelength range).

For the light-absorbing optoelectronic device component, several materials and structures have been explored, including bulk and epitaxially grown thin-film semiconductors, p-n junction diodes, and organic photovoltaics.

Color-selective detection is desirable in many imaging applications, which may include a photoabsorbing device. Currently, such a function is primarily realized with charge-coupled devices (CCD) or complementary metal-oxide-semiconductor (CMOS) sensors, both of which rely on iterating optical lithography steps and associated doping and etching processes to manufacture. What is desired, therefore, are improvements in the performance and manufacturing efficiency of color-selective photoabsorbing devices.

SUMMARY

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

In one aspect, an optoelectronic device is provided. In one embodiment, the device includes:

an insulating substrate having a first electrode and a second electrode disposed thereon, wherein the first electrode and the second electrode are separated by an electrode gap;

a semiconductor layer spanning the electrode gap, said semiconductor layer providing a photoconductive electrical conduit between the first electrode and the second electrode; and a plurality of plasmonic nanoparticles abutting at least a portion of the semiconductor layer, wherein the plasmonic nanoparticles have a plasmon resonance spectrum, and wherein the optoelectronic device has wavelength-dependent enhanced efficiency across at least a portion of the plasmon resonance spectrum compared to the optoelectronic device without the plurality of plasmonic nanoparticles.

In another aspect, an optoelectronic device is provided. In one embodiment, the device includes:

(a) an insulating substrate having a first electrode and a second electrode disposed thereon, wherein the first electrode and the second electrode are separated by an electrode gap;

(b) a photosensitive composite spanning the electrode gap to provide a photoconductive electrical conduit between the first electrode and the second electrode, said photosensitive composite comprising:

(i) a semiconductor layer spanning the electrode gap, said semiconductor layer having a first photoconductive response in the first wavelength range; and (ii) a plurality of plasmonic nanoparticles abutting at least a portion of the semiconductor layer, wherein the plasmonic nanoparticles have a plasmonic enhancement in the first wavelength range, wherein the photosensitive composite has a second photoconductive response in the first wavelength range that is greater than the first photoconductive response, said second photoconductive response manifesting as a wavelength dependent enhancement over the first photoconductive response as a result of the wavelength-dependent characteristics of the plasmonic resonances.

DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein:

FIG. 2A is a plan view; and FIG. 2B is a cross-sectional view of line 2B-2B in FIG. 2A.

FIGS. 3A and 3B are micrographs of a representative optoelectronic device having interdigitated comb electrodes in accordance with embodiments provided herein, wherein FIG. 3A is the device before, and FIG. 3B is after, Au NP deposition. Scale bars are 500 nm.

FIG. 8A: Responsivity for two QD photodetectors of 440 nm film thickness with (dashed line) and without (dashed-dotted line) Ag NPs. FIG. 8B: Dashed lines: responsivity enhancement for devices with 440 nm and 100 nm film thicknesses. Dotted lines: absorption enhancement of QD film with 440 nm and 100 nm film thicknesses. Devices were biased at 20 V for responsivity measurements.

DETAILED DESCRIPTION

Figure 1A:
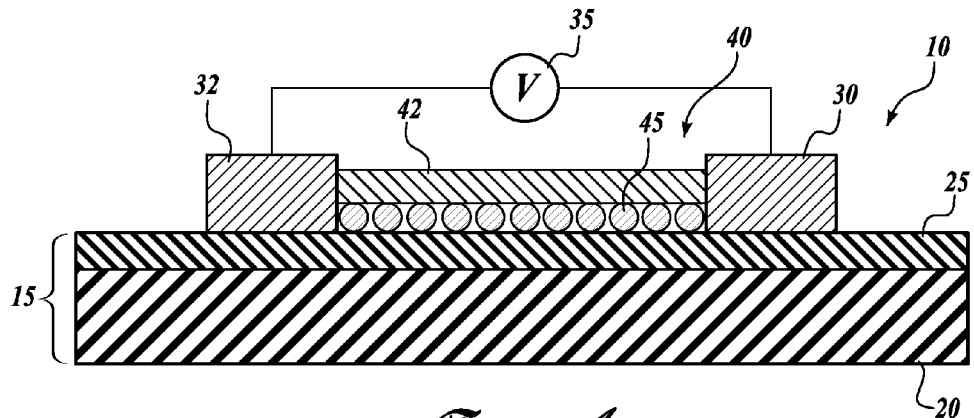
FIGS. 1A-1C are cross-sectional drawings of representative optoelectronic devices in accordance with embodiments provided herein.

Photoabsorbing optoelectronic devices, such as photodetectors and photovoltaics, are provided. The devices are sensitized to a particular wavelength (or range of wavelengths) of electromagnetic radiation such that the devices provide increased performance efficiency (e.g., external quantum efficiency ("EQE")) at the wavelength. Accordingly, when the devices are sensitized to a wavelength in the visible spectrum, the devices are referred to as "color-selective."

While exemplary embodiments provided herein are described in terms of the optoelectronic device operating as a color-selective photodetector, it will be appreciated by those of skill in the art that photodetectors of the type described herein can also operate as photovoltaics by slightly modifying the device composition (e.g., the composition of the electrodes) and how the device is integrated into a circuit (e.g., the voltage applied to a photodetector is generally much larger than that generated by a photovoltaic).

The device includes a photoconductive semiconductor layer spanning an electrode gap between two electrodes to provide a photoconductive electrical conduit. Abutting the semiconductor layer is a plurality of plasmonic nanoparticles ("NPs"). In certain embodiments, the combination of the semiconductor layer and the plasmonic nanoparticles is referred to as a "photosensitive composite."

The semiconductor layer can be any photosensitive semiconductor material. As used herein, the term "photosensitive" refers to a material having an electrical response to light. Typically, the photosensitive material will experience an increase in conductivity based on exposure to light. A typical mechanism for photosensitivity is photoconductivity. Photosensitive and photoconductive semiconductor materials are well known to those of skill in the art.

Representative photosensitive semiconductor materials include silicon, compound semiconductors (e.g., GaAs).

In certain embodiments, the semiconductor material is a plurality of quantum dots ("QDs"). Representative quantum dots can be formed from materials such as CdSe/ZnS, CdSe, CdS, CdTe, PbS, PbSe, InP, Si, Ge, and combinations thereof. Quantum dots can be of a core/shell composition, wherein the core and shell are different semiconductor materials, or wherein the core is a semiconductor and the shell is a non-semiconductor layer, such as a surfactant or polymer, which can provide QDs with non-inherent properties, such as solubility in certain solvents, biocompatibility, and the like. In certain embodiments, the quantum dots are colloidal quantum dots.

Quantum dots can be used as a photosensitive material if deposited such that a plurality of QDs span the electrode gap. The photosensitivity of QDs is well known to those of skill in the art.

The semiconductor material can be formed by any technique known to those of skill in the art. Traditional semiconductor processing methods, such as chemical vapor deposition, photolithography, e-beam deposition, and evaporation, can be used. Additionally, less-traditional techniques, such as spin- or drop-coating from solution, can be employed. Such solution-based techniques are particularly useful, for example, if the semiconductor material is a plurality of quantum dots.

The plasmonic nanoparticles provide the wavelength (i.e., color) selectivity of the optoelectronic device. The plasmonic NPs are metal nanoparticles, such as nanoparticles of gold, silver, copper, aluminum, and the like. The diameter of the nanoparticles, as well as the composition, determines the plasmon resonance characteristics.

Based on the size and composition of the plasmonic nanoparticles, particular wavelengths of light will produce plasmonic excitation in the plasmonic nanoparticles that results in strongly enhanced optical power density at the surface of the NP. This enhanced optical power density contributes to the photoconductivity of the semiconductor layer, thereby improving the overall photoconductive properties of the device.

The plasmonic enhancement is unique to each size and composition of plasmonic nanoparticles (e.g., similarly sized gold and silver nanoparticles have different plasmonic excitations). Therefore, at a particular excitation wavelength, two different sizes/compositions of plasmonic NPs will provide different degrees of plasmonic enhancement when in the photosensitive composites.

The plasmonic enhancement occurs across at least a portion of a plasmon resonance spectrum (i.e., range of wavelengths). The plasmon resonance spectrum is defined as the wavelength range of incident electromagnetic radiation in which the plasmonic nanoparticles demonstrate a plasmon resonance. The plasmon resonance spectrum can be determined using any methods known to those of skill in the art. For example, by spectroscopically or theoretically determining the extinction cross-section of the plasmonic NPs.

It will be appreciated that plasmon resonance, and, therefore, plasmonic enhancement of the provided devices, is dependent in part on the local environment in which the NPs are situated. For example, NPs in solution versus in a solid matrix will likely have different plasmon resonance spectra.

The plasmonic enhancement provided by the plasmonic nanoparticles manifests itself by improving the efficiency of the optoelectronic device. Typically, the device efficiency is measured as the EQE. Essentially, this means that devices that include the plasmonic nanoparticles have a greater probability of reacting to an incident photon compared to a similar device that does not include the nanoparticles. For example, if the device is a photodetector, the improved efficiency of a photodetector having a photosensitive composite comprising the plasmonic nanoparticles is because the device will have an increased probability of detecting an incident photon having a wavelength within the plasmon-enhanced spectral region, compared to a similar photodetector without the plasmonic NPs.

Because the surface plasmons are only generated at certain wavelengths of light, the photoconductivity enhancement is wavelength-dependent (i.e., color-selective). Accordingly, in one embodiment, the device is a color-selective photodetector. In this regard, in another embodiment, two or more devices are combined, each having a plasmonic enhancement at a different wavelength, so as to provide enhanced detection of two or more wavelengths (colors) of light. For example, three detectors could be used together in a pixel, wherein each device is sensitized to one of red, green, and blue light.

In one embodiment, the plasmon resonance spectrum has a spectrum maximum between 390 nm and 750 nm (i.e., in the visible spectrum). In other embodiment, the plasmon resonance is in the ultraviolet or infrared spectra.

Figure 4:
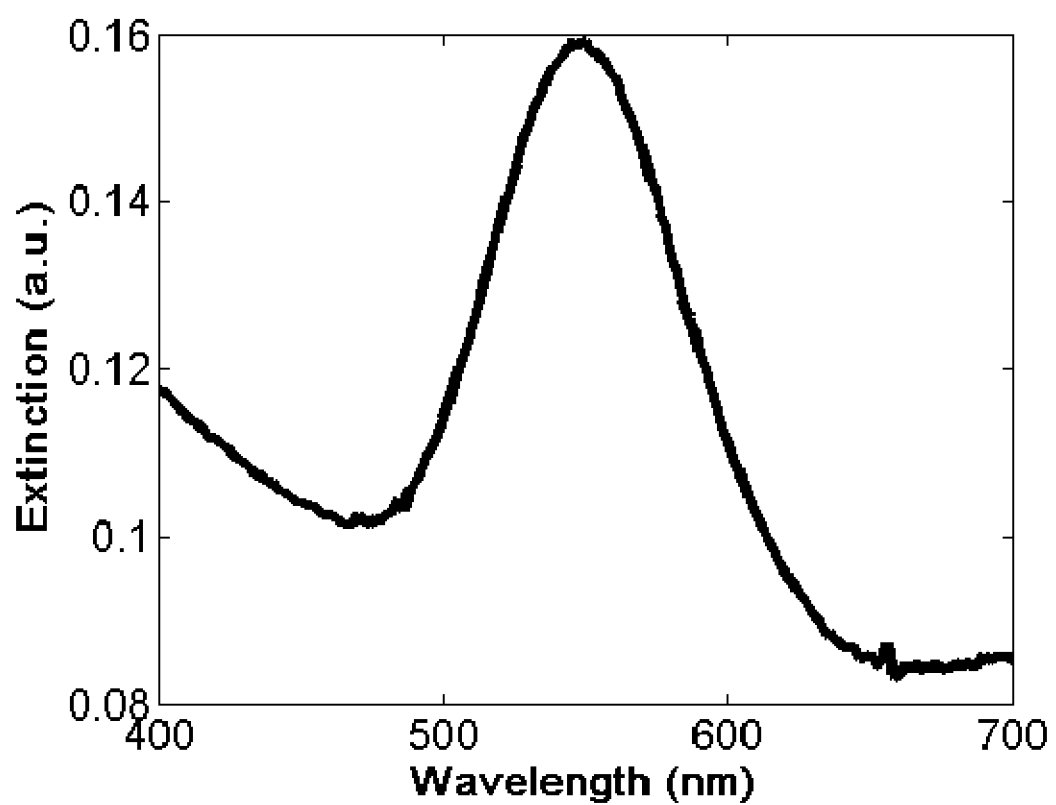
FIG. 4 graphically illustrates the extinction spectrum of 15 nm gold NPs useful in the embodiments provided herein.
Figure 7:
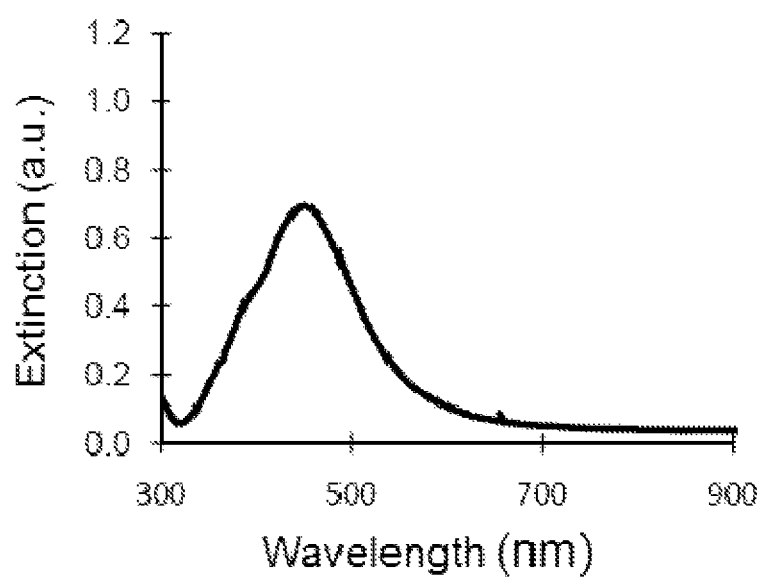
FIG. 7 is the extinction spectrum of 80 nm silver NPs useful in the embodiments provided herein.

Exemplary plasmonic enhancement is provided using gold or silver plasmonic nanoparticles are set forth below in Examples 1 and 2, respectively. For example, the extinction spectra of exemplary gold and silver plasmonic nanoparticles useful in the provided devices are shown in FIGS. 4 and 7, respectively.

The wavelength-dependent enhancement of the provided devices arises from the plasmon resonance of the NPs. At a wavelength enhanced by the plasmon resonance, the plasmonic enhancement leads to an improvement in device efficiency. Device efficiency can be defined in several different ways, and also depends on what type of device is being enhanced.

Photodetectors with plasmonic enhancement will have improved external quantum efficiency ("EQE") compared to the same device without the plasmonic NPs. EQE for a photodetector is defined as the number of charges collected per second divided by the number of photons input to the device active area (i.e., the electrode gap area) per second. The mechanisms within the device that lead to the improved EQE are sometimes difficult to determine. Without wishing to be bound by theory, the EQE is improved through one or more of improved absorption and/or carrier mobility, and/or the addition of conduction paths between the electrodes.

For photovoltaics/solar cell, the enhancement can be seen for either or both of power conversion efficiency and EQE. EQE for solar cells only characterizes short-circuit current. Power conversion efficiency is a parameter taking into account both short-circuit current and open-circuit voltage.

Surface plasmons are resonant electron oscillations at metal dielectric interfaces. Plasmonic NPs under plasmon resonance have two main properties that are beneficial in enhancing photo-absorbing devices, such as those provided herein. First, the optical near-field around the metal NPs is greatly enhanced (concentrated), which leads to improved absorption of the optical field by the semiconductor layer. The second benefit is the enhanced scattering of light from the metal NPs. The first property, much larger in magnitude than the second, is a near-field effect, existing only in the close vicinity (a few tens of a nanometer) of the plasmonic NP. The second one is a far-field effect and can reach further. However, for maximum improvement of device efficiency, the plasmonic NPs are abutting, or within 1 nm of the semiconductor layer so as to take advantage of both near- and far-field effects.

The photosensitive composite can be formed in any configuration that provides plasmonic nanoparticles abutting the semiconductor material so as to provide a plasmonic enhancement in a wavelength-dependent manner.

Figure 1B:
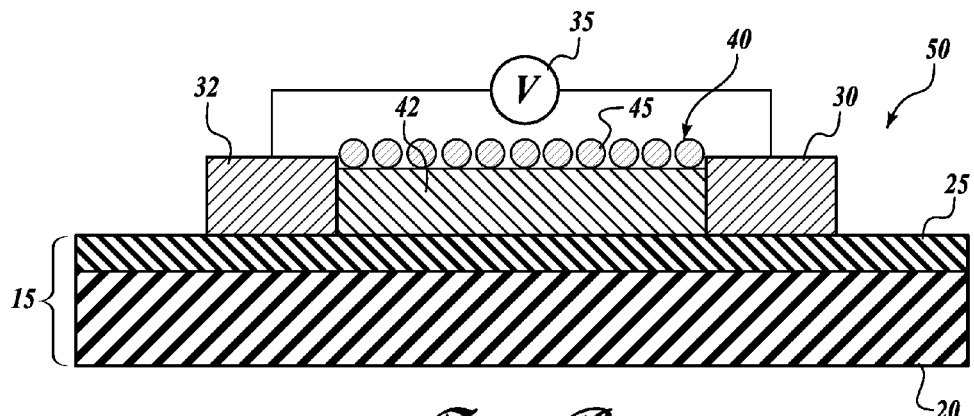
Figure 1C:
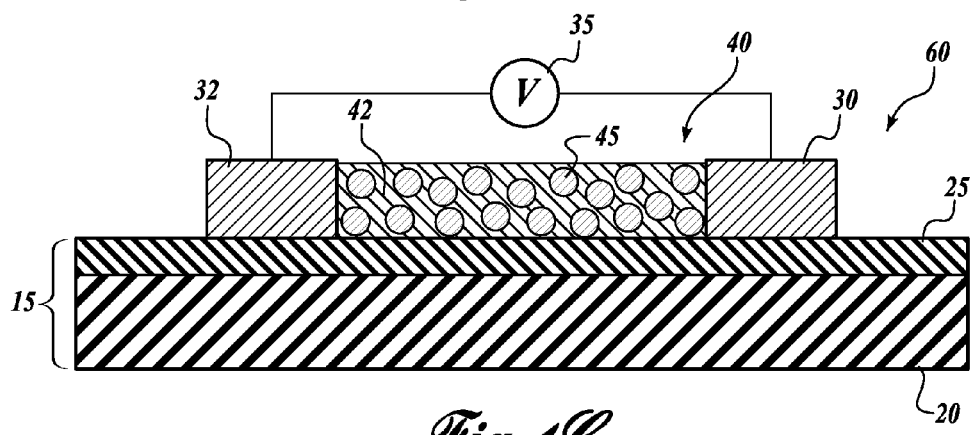

Three exemplary device configurations are set forth in FIGS. 1A-1C. Referring to FIG. 1A, a device 10 is provided wherein a substrate 15 includes a handle 20 (e.g., silicon) and an insulating layer 25 (e.g., silicon dioxide). It will be appreciated that a single insulating layer can be used as a substrate 15, as well.

A first electrode 30 and second electrode 32 are disposed on the substrate 15, with an electrode gap therebetween. The first electrode 30 and second electrode 32 can be either the same or different in composition. For photodetectors, the electrodes can be the same material (e.g., gold). However, for photovoltaics, the electrodes must have a different work function (i.e., they must be different materials). The electrodes can be formed using techniques known to those of skill in the art (e.g., photolithography, e-beam lithography, shadow mask deposition, and the like).

The electrode gap is filled with a photoconductive composite 40 that includes a semiconductor material 42 and a plurality of plasmonic nanoparticles 42.

In the embodiment illustrated in FIG. 1A, the NPs 45 are intermediate the semiconductor material 42 and the substrate 15. In this embodiment, the NPs 45 are excited into plasmon resonance when light of the appropriate wavelength passes through the substrate 15 and/or the semiconductor material 42 to reach the NPs 45. A specific embodiment of the device of FIG. 1A is described further in FIGS. 2A and 2B and Examples 1 and 2, wherein the semiconductor material 42 is a plurality of quantum dots.

In the embodiment illustrated in FIG. 1B, a device 50 is provided wherein the NPs 45 are above the semiconductor material 42 and the substrate 15. In this embodiment, the NPs 45 are excited into plasmon resonance when light directly impinges on them, or if the light passes through the substrate 15 and the semiconductor material 42 to reach the NPs 45. In this device configuration, the semiconductor material 42 must receive light that passes through the NPs 45 and/or substrate 15.

In the embodiment illustrated in FIG. 1C, a device 60 is provided wherein the NPs 45 are interspersed with the semiconductor material 42. In this embodiment, the NPs 45 are excited into plasmon resonance when light passes through the substrate 15 and/or the semiconductor material 42 to reach the NPs 45.

If the optoelectronic device is operated as a photodetector, a voltage 35 is applied across the electrodes 30 and 32. If the device is operated as a photovoltaic, the electrodes 30 and 32 are connected to a circuit that includes a component configured to receive the electricity generated by the device (e.g., a battery).

Figure 2A:
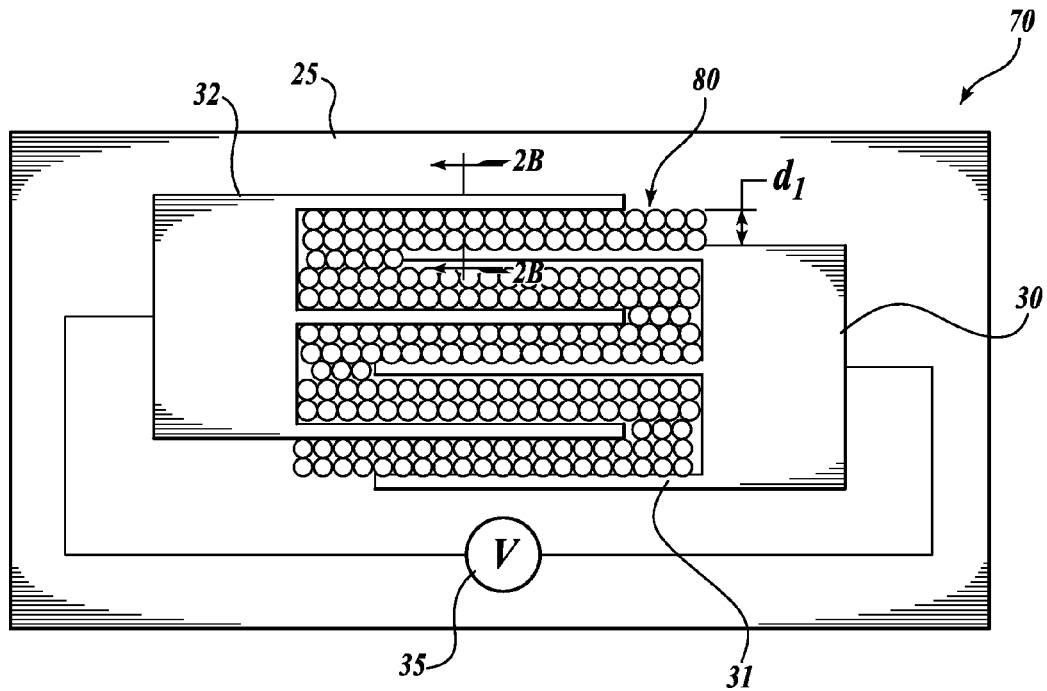
FIGS. 2A and 2B are schematic drawings of a photodetector integrated with plasmonic nanoparticles in accordance with embodiments provided herein, where
Figure 2B:
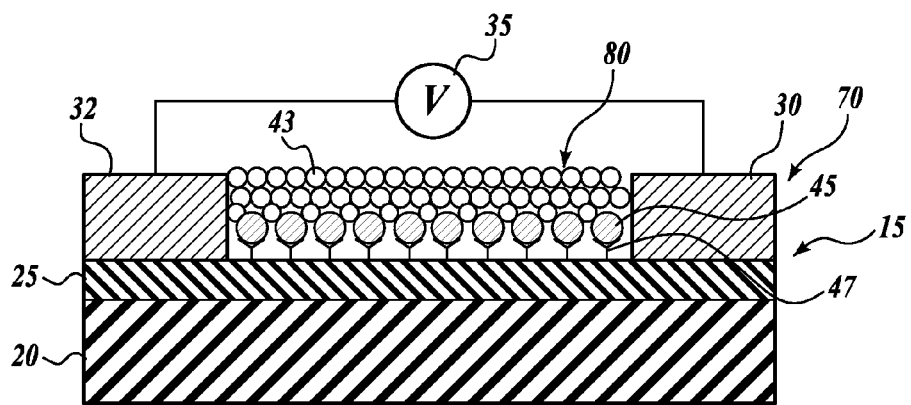

In certain embodiments, devices are provided that include an adhesion layer binding the nanoparticles to the substrate. Referring to FIGS. 2A and 2B, a device 70 is provided having a handle 20, an insulator 25, a first electrode 31 interdigitated with a second electrode 32, and a photosensitive composite 80 therebetween. The composite includes a plurality of QDs 43, spanning the electrode gap, and a plurality of NPs 45 intermediate the QDs 43 and insulator 25. So as to aid in fabricating the device 70, the NPs 45 are bound to the insulator 25 by an adhesive layer 47, such as a self-assembled monolayer. By binding the NPs 45, solution-based processing, such as drop-casting, can be used to deposit the QDs 43 without washing away the NPs 45. The device 70 operates as a photodetector by applying a voltage 35 across the electrodes 30 and 32. Alternatively, the device 70 can be used as a photovoltaic, as described elsewhere herein.

In certain embodiments the adhesion layer is a self-assembled monolayer. In certain embodiments, the NPs adhered using the adhesion layer form a monolayer.

Representative adhesion layers 47 include 3-aminopropyltriethoxysilane ("APTES") and (N-[3-(trimethoxysilyl)propyl]-ethylene diamine) ("TMSPED"), which are known to bind gold and silver, to silicon dioxide. It will be appreciated that any adhesion layer known to those of skill in the art is useful in the provided embodiments, as long as the adhesion layer immobilizes the NPs adjacent the substrate.

Alternatively, an adhesion layer can be used to adhere (e.g., bind) NPs to the semiconductor material. For example, the upper face of the semiconductor material could be functionalized with an adhesion layer so as to facilitate the adhesion of NPs to the upper face so as to form a device similar to that illustrated in FIG. 1A.

Devices such as those illustrated in FIGS. 1A and 1C can be fabricated through sequential deposition of the various layers of the composite 40 (e.g., depositing the NPs 45 and then the semiconductor 42 to form the device of FIG. 1A. An adhesion layer can also be incorporated into fabrication of the device, as set forth above.

Devices such as those illustrated in FIG. 1C can be formed by solution deposition of a composite of QDs and NPs to provide a single-step solution-based route to forming the photoconductive composite. Alternatively, the semiconductor material and NPs can be co-deposited using vapor-based techniques, or any other techniques known to those of skill in the art.

Additional aspects include methods for operating a photoabsorbing optoelectronic device, as disclosed herein.

Still further aspects include methods for fabricating photoabsorbing optoelectronic devices as provided herein.

The following examples are intended to illustrate exemplary embodiments of the optoelectronic devices and related methods of fabrication and use. The examples do not limit the scope of the disclosure.

EXAMPLES

Example 1

Gold Plasmonic Nanoparticle Photodetector

The color-selective device structure of this example is based on nanoscale QD photodetectors, which are fabricated by drop-casting nanocrystal QDs in a nanogap between electrodes. Such QD photodetectors have a typical external quantum efficiency (EQE) of 3.7%. For a color-selective detector, comb-structure electrodes are used to increase the active area of the device while still maintaining nanometric charge transportation distance, as shown in FIG. 2A. A gold NP layer is introduced between the QD layer and the substrate to act as color-selective enhancer, as illustrated in FIG. 2B. By using Au NPs of different size and/or shape, its plasmon resonance wavelength will change accordingly, and therefore enhance the QD photodetector EQE for the chosen wavelength range. Compared to electron-beam lithography defined plasmonic structures, an advantage of this scheme is that the plasmonic components are flexibly integrated through a self-assembly process.

Figure 3A:
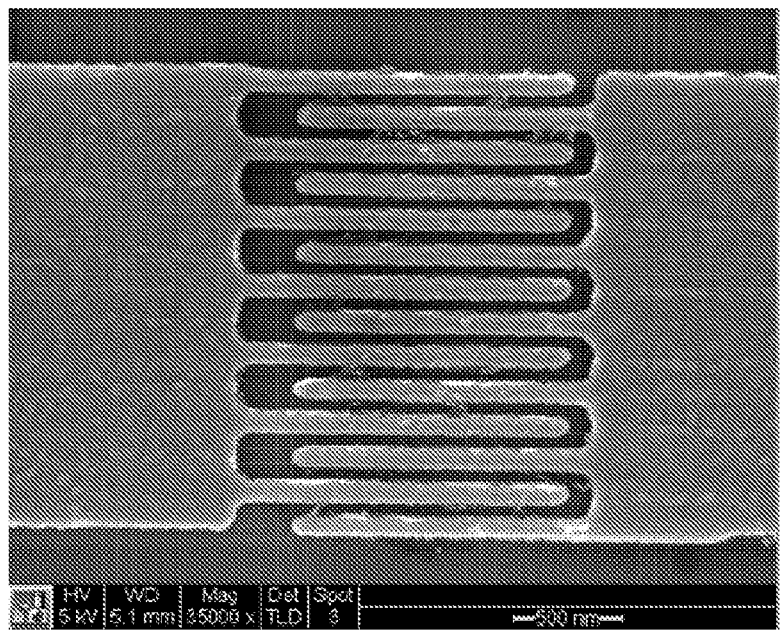
Figure 3B:
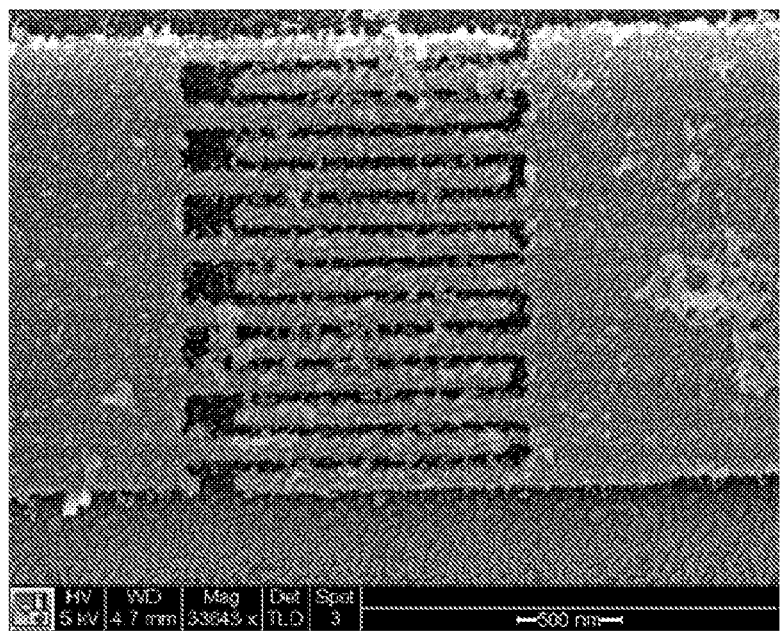

To fabricate the device, the electrode-patterned substrate is first cleaned by oxygen plasma and treated with 3-aminopropyltriethoxylsilane (APTES). Then a monolayer of carboxylated Au NPs, with a nominal size of 15 nm and a plasmon resonance at ~550 nm, is self-assembled to the substrate. The QD photodetector is fabricated by drop-casting, partially ligand-removed CdSe/ZnS QDs with emission at 614 nm onto the substrate. Scanning electron micrographs of a pair of comb-electrodes before and after Au NP deposition are shown in FIGS. 3A and 3B, respectively.

Figure 5A:
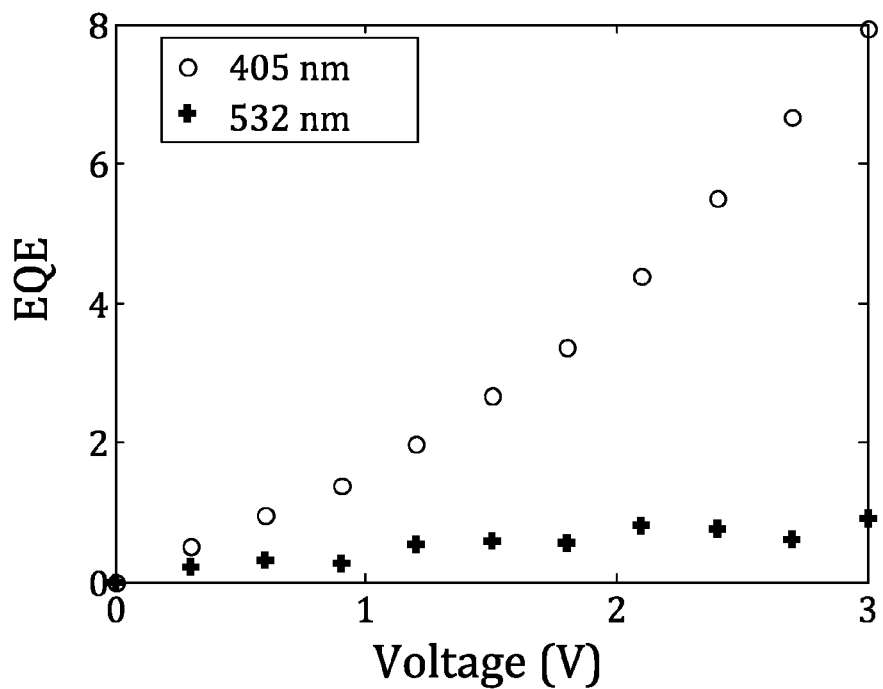
FIGS. 5A and 5B. Absorption-weighted external quantum efficiency of photodetectors with (FIG. 5A), and without (FIG. 5B) Au nanoparticles, in accordance with the embodiments provided herein. Illumination is at both 532 nm and 405 nm.
Figure 5B:
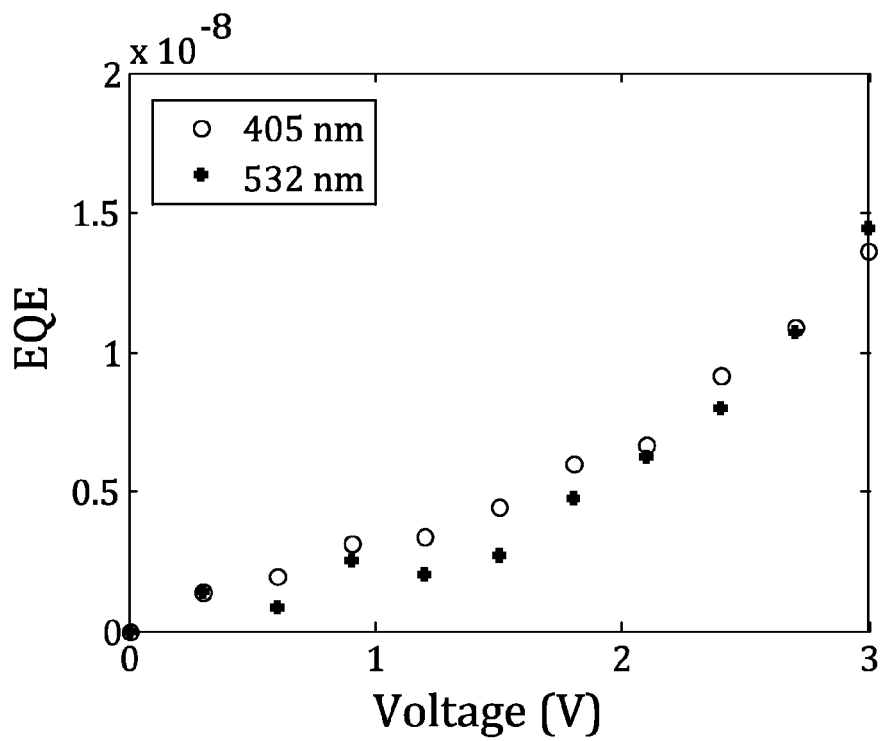

To investigate how Au NPs influence the EQE of QD photodetectors, lasers at two wavelengths, 532 nm and 405 nm, are used in the experiment. Because the plasmon resonance has a relatively broad distribution with the full width at half maximum of ~70 nm, as shown in FIG. 4, the 532-nm laser has a good spectral overlap with the ~550-nm plasmon resonance of the Au NPs, while the 405-nm wavelength is far enough from the resonance for which we can assume plasmons have insignificant influence on the device performance. Both lasers are coupled to a lensed multi-mode fiber probe to illuminate the sample. Photocurrent of QD photodetectors with 532-nm and 405-nm illumination is measured respectively. EQE is defined as the number of charges collected per second divided by the number of photon input to the device active area per second. Since the intrinsic absorption of QDs varies with wavelength, to study the impact of plasmon resonance on device EQE, we calculate absorption weighted EQE at the two illumination wavelengths by dividing the measured EQE with the absorption coefficient of QD at a corresponding wavelength. FIG. 5A shows the absorption-weighted EQE versus applied bias of a gold NP QD photodetector. The absorption-weighted EQE is consistently higher for 532-nm illumination than for 405 nm illumination, with a 6.6 fold enhancement at the bias of 3V. For comparison, a control device with only QDs and no Au NPs is tested, and its absorption-weighted EQE is plotted in FIG. 5B. The absorption-weighted EQE of 532 nm and 405 nm is comparable for the latter case. The variation of the ratio comes mainly from the power fluctuation from the 532-nm laser.

Figure 6A:
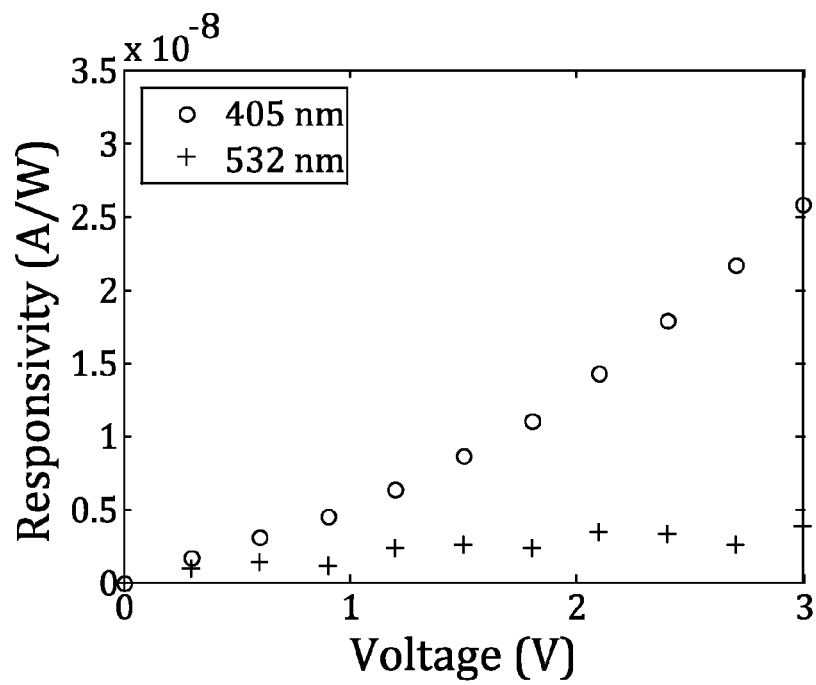
FIGS. 6A and 6B. Responsivity plots of photodetectors with (FIG. 6A) and without (FIG. 6B) Au NPs, in accordance with the embodiments provided herein. Illumination is at both 532 nm and 405 nm.
Figure 6B:
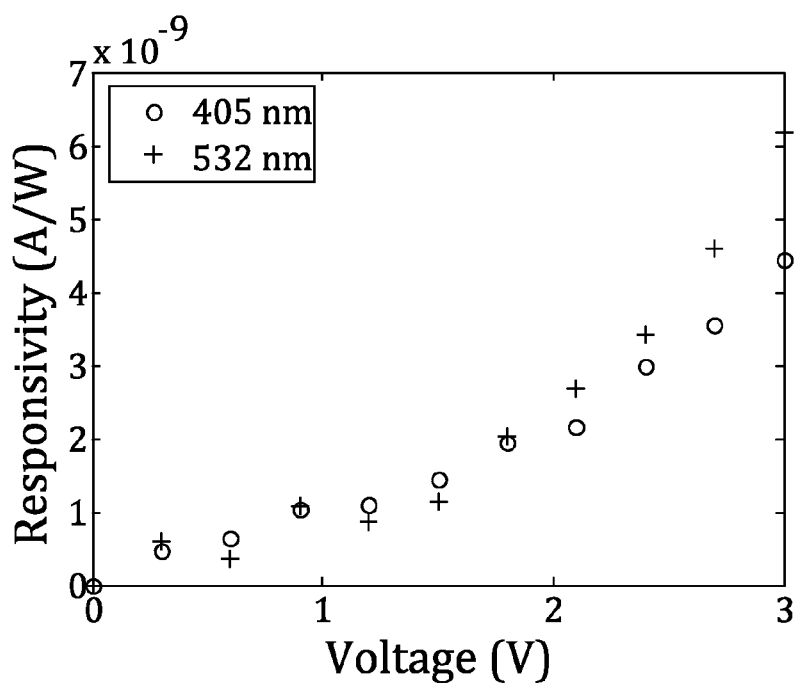

Responsivity plots of the photodetectors with (FIG. 6A) and without (FIG. 6B) Au NPs further demonstrate the enhancement provided by the plasmonic gold nanoparticles.

In summary, a color-selective photodetector fabricated from plasmonic Au NPs and QDs has been demonstrated. Enhanced EQE for illumination wavelengths near the plasmonic resonance wavelength was achieved. With a simple two-step fabrication procedure, this scheme opens the way to fabricate color-selective photodetectors down to nanometric pixel size and on a wide variety of substrates.

Example 2

Silver Plasmonic Nanoparticle Photodetector

In this example, a silver NP-enhanced photodetector based on colloidal quantum dot is described. We chose this system not only because, as a very promising material for photodetectors and photovoltaics, the effect of plasmons on a colloidal QD film device had not been explored yet, but also because the combination of colloidal metal NPs and colloidal QD film was a very desirable one in many ways. First, both colloidal metal NPs and colloidal QD are made by solution-based synthesis, which is well suited for large-scale production. Second, they can be easily deposited though processes such as self-assembly, drop-cast, spin-cast, or spray-on methods. Third, due to the result of versatile deposition method, they can be integrated on a wide variety of substrates ranging from Si wafers, glass substrates, to flexible polymer substrates. Therefore, the integration of colloidal metal NPs and colloidal QD film proffers a promising candidate for future solutions of mass-production scalable low cost light-absorbing optoelectronic devices.

The device structure is formed by drop-casting nanocrystal QDs between electrodes. The structure of the device is illustrated in FIGS. 2A and 2B. An Ag NP layer 45 is introduced between the QD layer 80 and the glass substrate 25 as the plasmonic enhancer. As the character of the fabrication approach we adopted here is long-range uniformity rather than precise controlling of individual particle positions, we used 40 μm wide-gap electrodes to ensure that the measurement results represent large-scale average effect.

To fabricate the device, the electrode-patterned substrate was first cleaned by oxygen plasma and treated with 3-aminopropyltriethoxylsilane (APTES). Then a monolayer of carboxylated Ag NPs, with a nominal diameter of 80 nm and an extinction peak at ~480 nm (as illustrated in FIG. 7) in solution, was self-assembled to the substrate. We found that using a high concentration colloidal solution (1 mg/ml) with relatively short assembly time (10 min) was critical to obtaining uniformly distributed high-density Ag NP monolayers. The optimized recipe yielded an average density of 42 particles/$\mu m^2$ on glass substrate. The scattering spectrum peak of Ag NPs self-assembled on glass substrate was determined to be at 415 nm. Partially ligand-removed CdSe/ZnS QDs with photoluminescence at 640 nm were drop-cast onto the substrate. By using different precast QD solution concentrations, devices with different film thickness were fabricated.

Figure 8A:
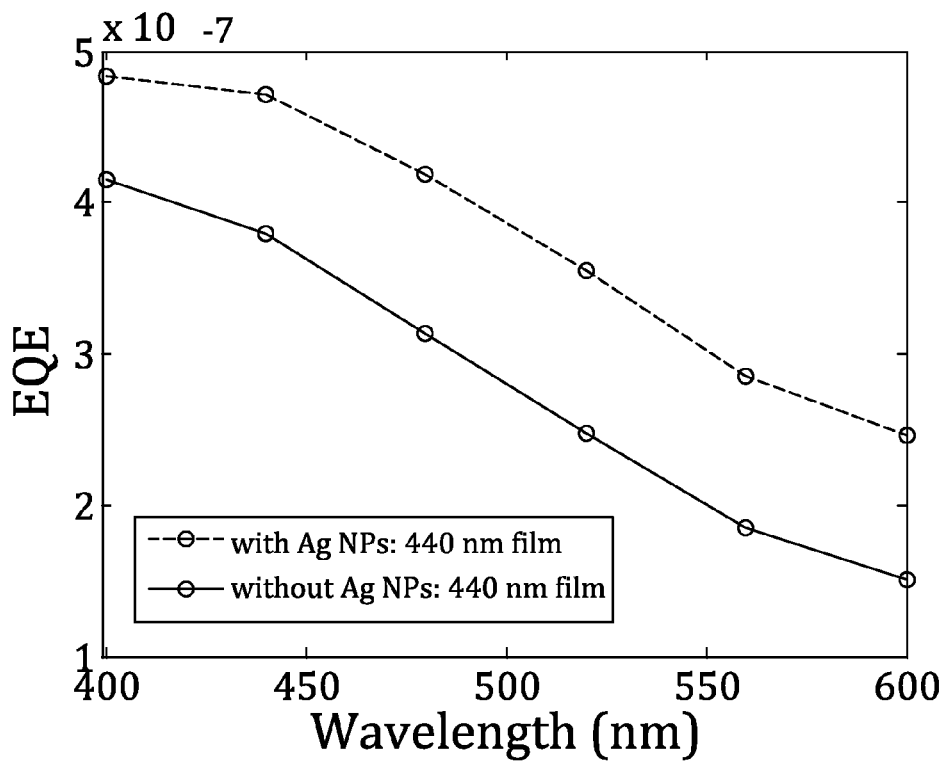
FIGS. 8A and 8B. Device responsivity and enhancement results.

To investigate how Ag NPs influence the performance of QD photodetectors, photocurrents generated at different wavelengths of illumination was measured and the result was compared with QD photodetectors processed from the same QD solution on the same substrate but without Ag NP integration. The incident light came from a halogen lamp, which was then passed through a monochromator with proper focusing optics and projected onto the sample surface. For each wavelength, about 200 data points for photocurrent were collected in a duration of 120 s with the device biased at 20 V and the average was used to represent the photocurrent at that wavelength. It is worth mentioning that careful comparison of dark currents was made between devices with Ag NPs and that without Ag NPs before QD deposition as well as after QD deposition. No consistent difference was measured in both cases, which indicated that the Ag NPs did not cause noticeable leakage current at present particle density level. Device responsivity was calculated based on the average photocurrent and the power of light incident upon the active area of the device. FIG. 8A shows the responsivity of two devices, one with Ag NPs, and one without, over the spectral range from 400 to 600 nm. Film thickness measurement by a profilometer confirmed that both QD photodetector devices had a film thickness of ~440 nm. The responsivity of the device with Ag NPs was higher than that without Ag NPs over the entire measured spectral range. Responsivity enhancement, which is defined as the ratio of responsivity of a device with Ag NPs to one that without Ag NPs, was plotted (green dash line) in FIG. 8B.

Figure 8B:
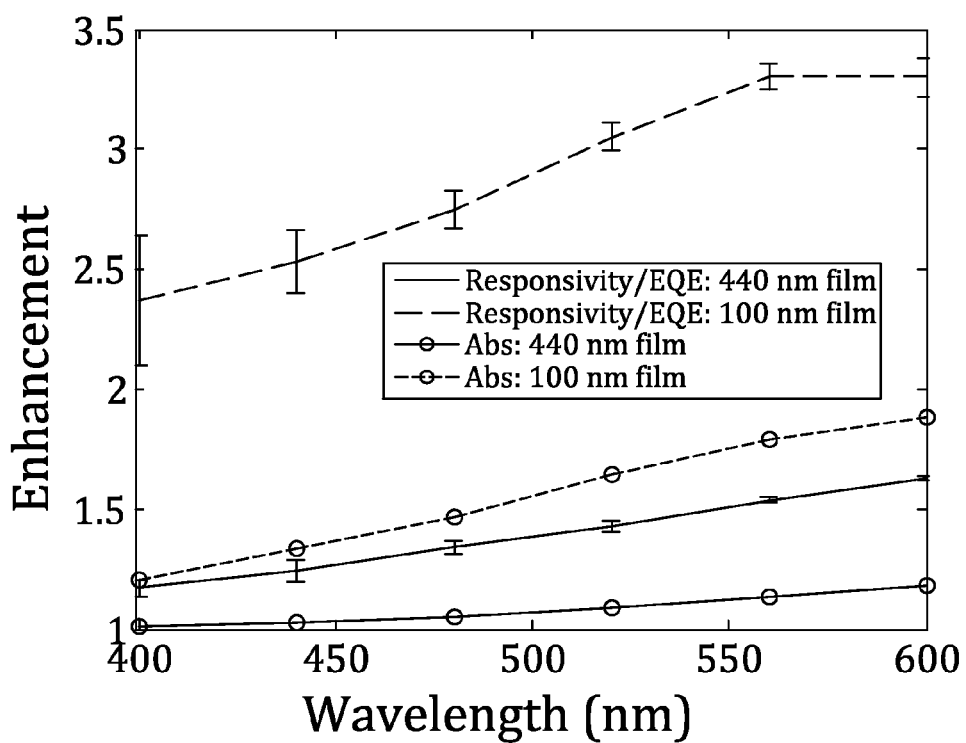

It was noticed that the responsivity enhancement increased with increasing wavelength. This phenomenon was expected due to two factors. First, as indicated by both simulation and film absorption measurement, the plasmon resonance of Ag NPs shifted to above 700 nm region (with the exact spectral positions to be 720 nm experimentally and 750 nm theoretically) after the QD deposition due to the dielectric constant change of the environment materials. As a result, the longer wavelength part of the measured spectrum lay closer to plasmon resonance and was enhanced more. Second, the wavelength-dependent absorption of QD film allowed more longer-wavelength portion of the incident spectrum to reach the plasmonic particles, and therefore relatively increased the input to plasmonic components at the longer wavelength. This effect of QD-film altered input spectrum for plasmon NPs was further confirmed when we measured the enhancement of a set of devices with thinner QD films. As shown in FIG. 8B, the responsivity enhancement for a 100 nm QD film (dashed line) was higher across the spectrum as the thinner QD film allowed more input power to transmit to plasmon particles.

Next, we investigated how the absorption enhancement compares with responsivity enhancement in the case of plasmonic QD photodetectors. To do this, we measured the absorption of QD films with and without Ag NP integration and the absorption enhancement was plotted in FIG. 8B. As expected, the absorption enhancement for both film thicknesses lay above 1 and increased with wavelength. However, there was a noticeable difference between absorption enhancement and responsivity enhancement, especially for the thinner 100 nm QD film. Considering that the film absorption includes the absorption from Ag NPs, which does not contribute to photocurrent, the difference between device responsivity enhancement and effective absorption enchantment of QDs is even bigger. The higher enhancement of responsivity suggested that, for plasmonic QD photodetector devices, there were additional performance enhancement mechanisms besides the enhancement of QD film absorption. One possibility is that the Ag NPs layer also facilitates the transportation of photoexcited carriers in such devices by introducing additional conduction paths between QDs—the thinner QD film device exhibiting a bigger difference likely due to a bigger portion of QD film within the vicinity of Ag NPs.

Figure 9:
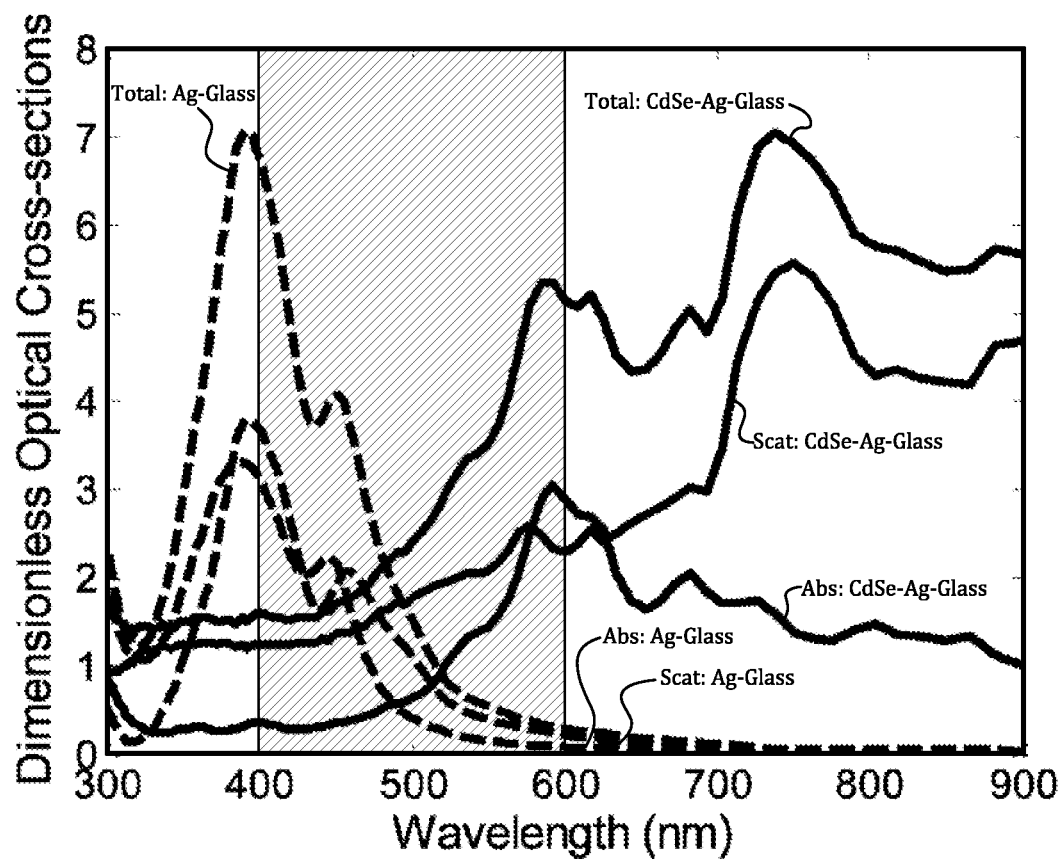
FIG. 9. Dimensionless optical cross-section spectrum of 80 nm-diameter Ag NPs on glass substrate before (dashed lines) and after (solid lines) CdSe QD deposition. The dimensionless optical cross-sections are calculated as the ratios of simulated optical cross-section areas to the geometrical cross-section area of Ag NPs (i.e., $\pi r^2$). The shaded area indicates the wavelength range in which device photocurrent measurements were taken.

Finite difference time domain method is used to calculate the optical cross-sections of 80 nm-diameter Ag nanoparticles (NPs) on glass slide before and after CdSe quantum dot (QD) deposition. The results are summarized in FIG. 9. It is clearly shown that the plasmonic resonance (extinction cross-section) of Ag NPs is shifted from ~390 nm to ~750 nm after CdSe QD deposition. Enhanced absorption of QD film due to scattering from Ag NPs is the origin of wavelength-dependent responsivity enhancement of the device, and indeed the trend of simulated scattering cross-section of Ag NPs (solid green line within the shaded region of the plot) is consistent with that of experimentally measured device responsivity enhancement.

In summary, we fabricated a solution-processed QD photodetector integrated with a self-assembled plasmonic NP layer and studied the effect of plasmon NPs on the performance of QD photodetector. Enhancement of responsivity for a spectrum range from 400 to 600 nm was observed and the enhancement factor increased with wavelength. The wavelength dependent behavior of responsivity enhancement was caused by (1) the relative position of measured spectrum to that of plasmon resonance of Ag NPs, and (2) the altered effective input spectrum for plasmonic NPs due to wavelength dependent absorption of QD film. As expected, QD photodetector devices with thinner film thickness exhibited larger responsivity enhancement. Increased absorption of QD film due to enhanced optical near field by plasmonic NPs was identified as one of the enhancement mechanisms. Additional enhancement mechanism was possibly due to the metal NP-assisted photoexcited carrier transportation during the device operation.

While illustrative embodiments have been illustrated and described, it will be appreciated that various changes can be made therein without departing from the spirit and scope of the invention.

The embodiments of the invention in which an exclusive property or privilege is claimed are defined as follows:

1. An optoelectronic device, comprising:
    an insulating substrate having a first electrode and a second electrode disposed thereon, wherein the first electrode and the second electrode are separated by an electrode gap;
    a semiconductor layer spanning the electrode gap, said semiconductor layer providing a photoconductive electrical conduit between the first electrode and the second electrode; and a plurality of plasmonic nanoparticles abutting at least a portion of the semiconductor layer, wherein the plasmonic nanoparticles have a plasmon resonance spectrum, and wherein the optoelectronic device has wavelength-dependent enhanced efficiency across at least a portion of the plasmon resonance spectrum compared to the optoelectronic device without the plurality of plasmonic nanoparticles.

2. The optoelectronic device of claim 1, wherein the plurality of plasmonic nanoparticles are intermediate the substrate and the semiconductor layer.

3. The optoelectronic device of claim 2, further comprising an adhesion layer intermediate the substrate and the plurality of plasmonic nanoparticles, wherein said adhesion layer is bound to both the substrate and the plurality of plasmonic nanoparticles.

4. The optoelectronic device of claim 3, wherein the adhesion layer is a self-assembled monolayer.

5. The optoelectronic device of claim 4, wherein the adhesion layer is selected from the group consisting of 3-aminopropyltriethoxylsilane ("APTES") and (N-[3-(trimethoxysilyl)propyl]-ethylene diamine) ("TMSPED").

6. The optoelectronic device of claim 3, wherein the plurality of plasmonic nanoparticles forms a monolayer on the adhesion layer.

7. The optoelectronic device of claim 1, wherein at least a portion of the plurality of plasmonic nanoparticles are interspersed within the semiconductor layer.

8. The optoelectronic device of claim 1, wherein the semiconductor layer is intermediate at least a portion of the plurality of plasmonic nanoparticles and the substrate.

9. The optoelectronic device of claim 1, wherein the plasmonic nanoparticles are selected from the group consisting of gold, silver, copper, aluminum, and combinations thereof.

10. The optoelectronic device of claim 1, wherein the semiconductor layer comprises a plurality of quantum dots.

11. The optoelectronic device of claim 10, wherein the quantum dots are colloidal quantum dots.

12. The optoelectronic device of claim 10, wherein the quantum dots are selected from the group consisting of quantum dots formed from CdSe/ZnS, CdSe, CdS, CdTe, PbS, PbSe, InP, Si, Ge, and combinations thereof.

13. The optoelectronics device of claim 10, wherein each of the plurality of quantum dots comprise a shell surrounding a semiconductor core.

14. The optoelectronic device of claim 1, wherein the optoelectronic device is a photodetector, and wherein the enhanced efficiency is an external quantum efficiency.

15. The optoelectronic device of claim 14, wherein the first electrode and the second electrode comprise the same material.

16. The optoelectronic device of claim 14, wherein the photodetector is a color-selective photodetector.

17. The optoelectronic device of claim 16, wherein the plasmon resonance spectrum has a spectrum maximum between 390 nm and 750 nm.

18. The optoelectronic device of claim 1, wherein the optoelectronic device is a photovoltaic device, and wherein the enhanced efficiency is external quantum efficiency or power conversion efficiency.

19. The optoelectronic device of claim 17, wherein the first electrode has a first work function and the second electrode has a second work function that is different from the first work function.

20. An optoelectronic device sensitized to a first wavelength range of electromagnetic radiation, the device comprising:
(a) an insulating substrate having a first electrode and a second electrode disposed thereon, wherein the first electrode and the second electrode are separated by an electrode gap;
(b) a photosensitive composite spanning the electrode gap to provide a photoconductive electrical conduit between the first electrode and the second electrode, said photosensitive composite comprising:
(i) a semiconductor layer spanning the electrode gap, said semiconductor layer having a first photoconductive response in the first wavelength range; and
(ii) a plurality of plasmonic nanoparticles abutting at least a portion of the semiconductor layer, wherein the plasmonic nanoparticles have a plasmonic enhancement in the first wavelength range,
wherein the photosensitive composite has a second photoconductive response in the first wavelength range that is greater than the first photoconductive response, said second photoconductive response manifesting as a wavelength dependent enhancement over the first photoconductive response as a result of the wavelength-dependent characteristics of the plasmonic resonances.

* * * * *